United States Patent [19]

Rambauske

[11] 3,982,824
[45] Sept. 28, 1976

[54] CATOPTRIC LENS ARRANGEMENT

[75] Inventor: Werner R. Rambauske, Carlisle, Mass.

[73] Assignee: Raytheon Company, Lexinton, Mass.

[22] Filed: Apr. 17, 1972

[21] Appl. No.: 244,393

Related U.S. Application Data

[63] Continuation-in-part of Ser. No. 203,684, Dec. 1, 1971, abandoned.

[52] U.S. Cl. ............................... 350/294; 350/293; 350/299
[51] Int. Cl.[2] .............................................. G02B 5/10
[58] Field of Search ............... 350/21, 27, 288, 293, 350/294, 299, 199

[56] References Cited
UNITED STATES PATENTS

| | | | |
|---|---|---|---|
| 2,198,014 | 4/1940 | Ott | 350/199 |
| 2,306,679 | 12/1942 | Warmisham | 350/294 |
| 2,741,691 | 4/1956 | Lee | 350/294 |
| 2,819,404 | 1/1958 | Herrnring | 350/294 |
| 3,107,296 | 10/1963 | Hine | 350/174 |
| 3,189,744 | 6/1965 | Ogland | 350/21 |
| 3,286,590 | 11/1966 | Brueggemann | 350/21 |
| 3,367,607 | 2/1968 | Bowen | 350/294 |
| 3,367,607 | 2/1968 | Bowen | 350/294 |
| 3,453,425 | 7/1969 | Whitaker | 350/294 |
| 3,455,623 | 7/1969 | Harris | 350/27 |
| 3,492,474 | 1/1970 | Yamaguchi et al. | 350/293 |
| 3,774,995 | 11/1973 | Perret | 350/294 |

*Primary Examiner*—R. V. Rolinec
*Assistant Examiner*—Michael J. Tokar
*Attorney, Agent, or Firm*—Philip J. McFarland; Joseph D. Pannone

[57] ABSTRACT

Different species of catoptric lens arrangements are shown, each one of the disclosed species being characterized by use of a quadratic conic mirror having real or virtual focal points displaced from a lens axis. With a quadratic conic mirror having such a characteristic, the image points of axial, or paraxial, rays are similarly displaced so that aperture blockage may be eliminated and achromatic aberrations may be reduced to such an extent as to make the lens arrangement diffraction limited.

17 Claims, 15 Drawing Figures

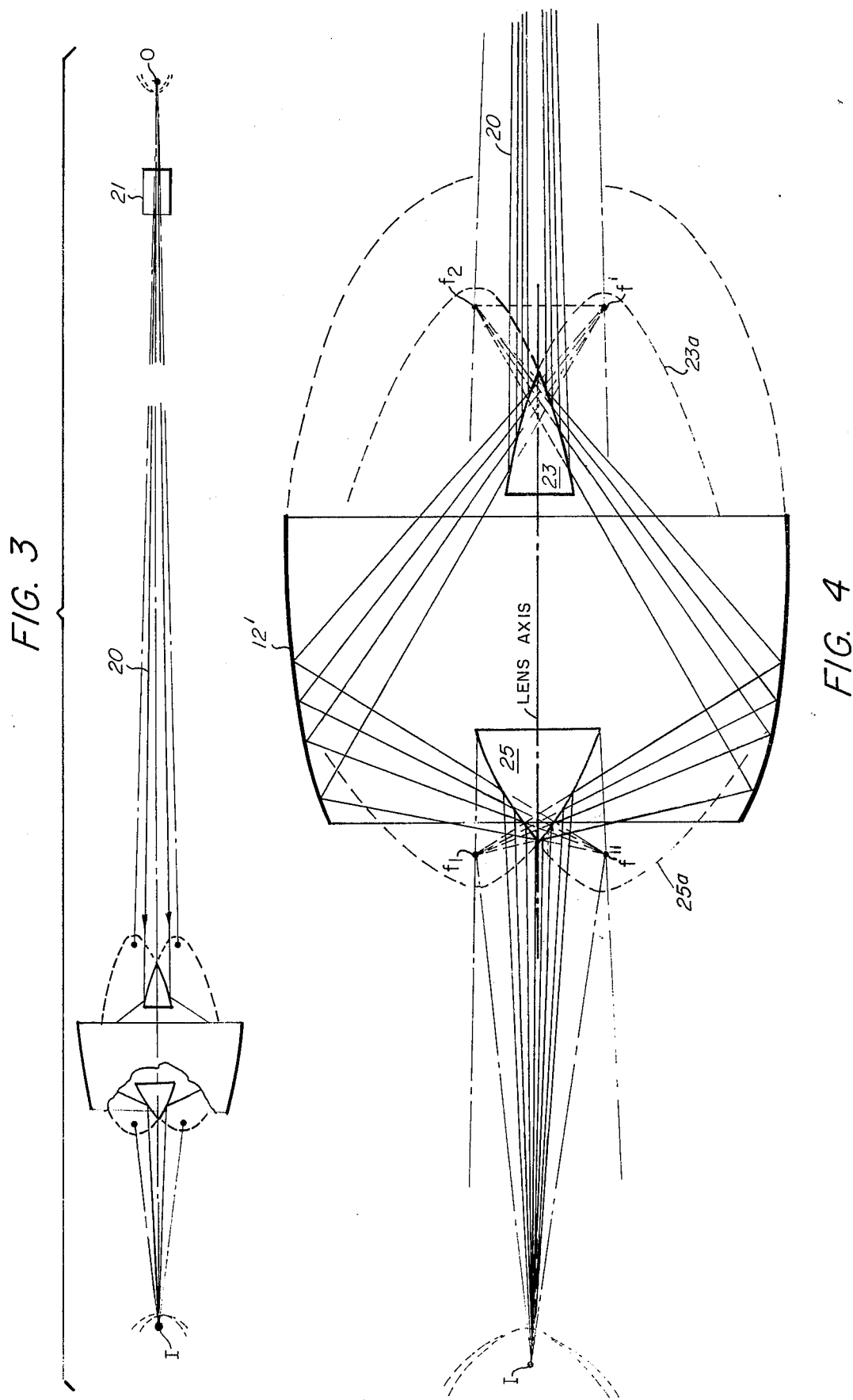

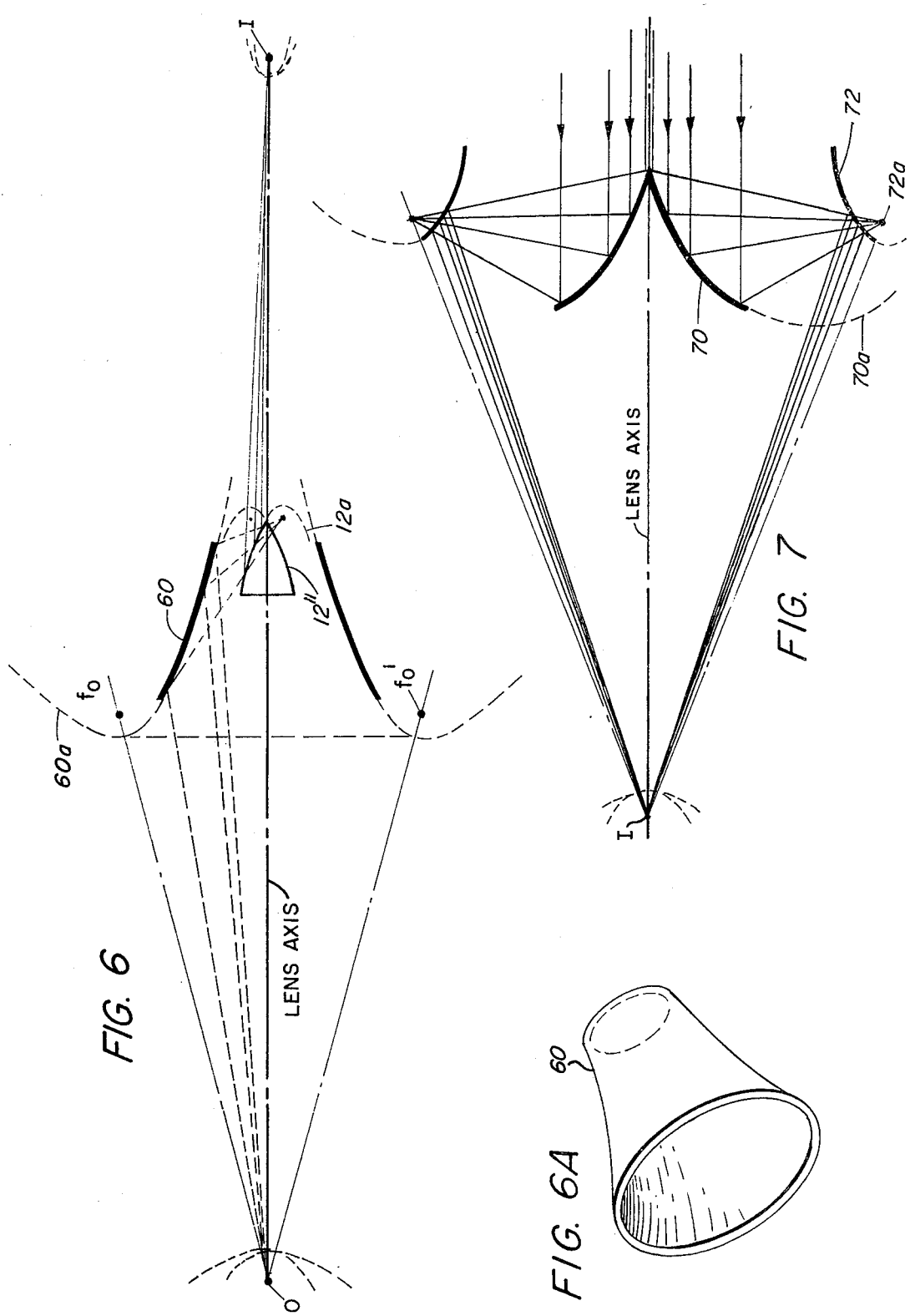

CATOPTRIC LENS ARRANGEMENT

This application is a continuation-in-part of application of Ser. No. 203,684 filed Dec. 1, 1971, entitled "Catoptric Lens Arrangement" and assigned to the same assignee as the present application, now abandoned.

BACKGROUND OF THE INVENTION

This invention pertains generally to lens arrangements for radiant energy and particularly to reflective, or catoptric, lens arrangements.

It is known in the art that either refractive or reflective elements may be arranged to focus or collimate "wave-propagated" energy, referred to herein as radiant energy. That is, wave-propagated energy such as electromagnetic energy or acoustic energy may be focused, or collimated, by lenses made from refractive materials or from reflective materials.

When refractive elements are used, focusing or collimating is accomplished by reason of the deflection from a straight path of the radiant energy in passing obliquely from one refractive element to another. Therefore, by judiciously selecting the material from which the refractive elements are fabricated and properly shaping such elements, lens systems may be made which satisfactorily focus or collimate radiant energy in many applications. There are, however, inherent limitations of refractive lens systems which militate against their use in many cases. For example, because the material from which refractive elements are made absorbs an appreciable portion of the radiant energy, unacceptable losses are experienced when the power level of the radiant energy is either very low or very high. When the amount of radiant energy is very low, any absorption of radiant energy in the lens elements is, of course, undesirable. When the amount of radiant energy is very high (as is the case, for example, when a laser beam is involved absorption of the radiant energy in the lens elements may be great enough to cause excessive heating of the lens elements so that such elements are rendered useless or even destroyed.

The foregoing difficulties may be almost completely avoided by using reflecting elements in a catoptric lens system. Unfortunately, however, other problems are encountered when reflecting elements are so used. First of all, the problem of aperture blockage is encountered. That is, in any known catoptric lens system, as the conventional Cassegrainian lens system wherein the focal points of cooperating reflecting elements are disposed along a lens axis, one of the reflecting elements obscures radiant energy to some degree, thereby causing vignetting. Another problem with any catoptric lens system is the fact that the reflecting elements must be spaced from each other. As a result, unless folded paths are provided for radiant energy within a catoptric lens system, the physical size of such a system must be, relatively speaking, much larger than the physical size of a refractive lens system having a comparable aperture.

"It has been proposed to provide, in a catoptric lens arrangement for radiant energy, a primary mirror in the form of a convex paraboloid and a secondary mirror in the form of a concave ellipsoid. When such mirrors are mounted with respect to each other so that: (a) the focal point of the primary mirror is coincident with one of the foci of the secondary mirror; and, (b) the xis of symmetry of the primary mirror is not coincident with the major axis of the secondary mirror, radiant energy in an incident paraxial beam is focused, to some degree, at the second focal point of the secondary mirror. It has been found, however, that a catoptric lens arrangement of this type is subject to the achromatic aberrations, i.e. spherical aberration, coma, astigmatism (or curvature of the field) and distortion. Such aberrations prevent the arrangement from being "diffraction limited".

As is known, it is not possible to eliminate all of the different achromatic aberrations from a simple catoptric lens. However, by constructing a compound lens, it is possible to balance the aberrations of different ones of the lens elements so as to reduce the overall effects of the various kinds of aberrations. Even when great care is taken, however, residual aberrations remain significant enough that, in designing high quality lenses, it is usually necessary to decide which aberrations are most detrimental to the purpose for which a particular lens arrangement is intended and then to reduce only the most detrimental aberrations to a negligible amount. Thus, in a telescope objective which is required to cover only a small angular field, spherical aberration and coma are the most important of the achromatic aberrations. Such aberrations may be reduced (while maintaining resolution) by using an objective lens with a long focal length and a small $f$-ratio. Following known design techniques to obtain a lens arrangement with the combination of a long focal length and a small $f$-ratio requires a physically large structure. Attendant mechanical and thermal problems must, therefore, be overcome to provide the required structural stability of the telescope. On the other hand, the objective lens for the ordinary camera, which covers a relatively large field, may be only partially corrected for spherical aberration and coma because of the greater importance of correcting astigmatism, curvature of field and distortion.

The difficulty in compromising between the various kinds of achromatic aberrations in the design of known less arrangements arises, in great measure, from the heretofore accepted theory that, in any compound lens arrangement, the real and virtual foci of each individual lens element must fall on the lens axis.

SUMMARY OF THE INVENTION

Therefore, it is an object of this invention to provide an improved catoptric lens arrangement in which the position of the real, or virtual, foci of the lens elements may be located, as desired, at points off the lens axis.

Another object of this invention is to provide an improved catoptric lens arrangement which uses symmetric reflecting elements without aperture blockage.

Another object of this invention is to provide an improved catoptric lens arrangement whose aperture may be varied as desired within wide limits without introducing excessive achromatic aberrations.

Still another object of this invention is to provide an improved catoptric lens arrangement whose physical size is reduced to a minimum without using folded paths for radiant energy passing therethrough.

These and other objects of this invention are attained by providing, in a catoptric lens arrangement, at least a primary and a secondary mirror, each one of such mirrors having a reflective surface corresponding in shape with the surface formed by moving a different one of a pair of complementary generatrices about a common, or lens, axis. Each generatrix for a diffraction is, preferably, a selected portion of a quadratic conic section (except the circular conic section), the axis of symmetry of each such conic section being displaced from the lens axis so that the loci of the focal points of the conic sections remain coincident as the pair of complementary generatrices are moved.

In one embodiment, the contemplated lens arrangement includes a primary mirror having a convex reflecting surface formed by rotating a section of a parabola about the axis of the lens arrangement (such primary mirror thereby taking an ogival shape having virtual foci on the circumference of a focal circle orthogonal to, and concentric with, the lens axis); and a secondary mirror having a concave reflecting surface formed by nutating a section of an ellipse about the lens axis (such secondary mirror thereby taking a parellipsoidal shape so that one of its foci lies on a focal circle which is coincident with the focal circle of the ogival shape of the primary mirror and the second one of its foci is fixed at a point along the lens axis). Radiant energy in a beam thereof (whether the rays in such beam are axial or paraxial, within relatively wide limits) falling upon the primary mirror is reflected as though it had originated at one of the virtual foci of such mirror and, after reflection from the secondary mirror, is focused at the second focal point of the latter mirror; conversely, radiant energy from a point source at the second focal point is passed in the reverse direction through the lens system to emanate therefrom in an axial collimated beam. In another embodiment, an exit mirror is added, such exit mirror being disposed in the path of the radiant energy between a modified form of the parellipsoidal secondary mirror so that three reflecting surfaces are used to form, from radiant energy from a point source, a diffraction limited beam. In other embodiments sections of hyperbolas or other conic sections are nutated around the lens axis to form confocal mirrors for various purposes.

DESCRIPTION OF THE PREFERRED EMBODIMENTS

For a more complete understanding of the principles of this invention, reference is now made to the following description of preferred embodiments illustrated in the accompanying drawings in which:

FIG. 3 is a sketch showing how the principles of this invention may be followed to produce a diffraction limited beam of energy from paraxial rays of radiant energy;

FIG. 4 is a sketch showing in particular the manner in which the reflecting surfaces of the catoptric lens arrangement of FIG. 3 may be generated;

Figure 8:
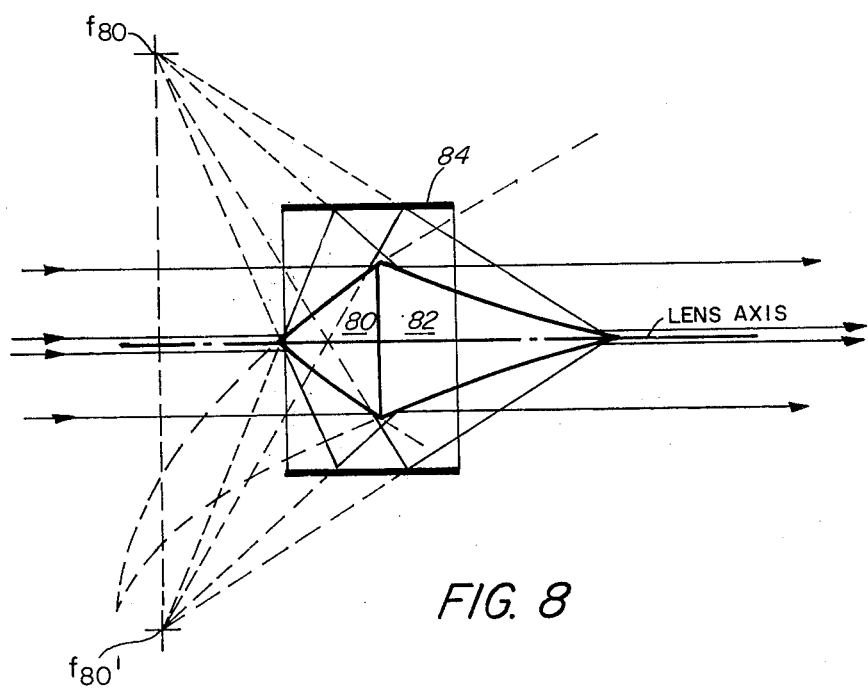

FIGS. 6 and 6A taken together illustrate a lens arrangement according to this invention which may be used to focus paraxial rays using convex reflecting elements;

FIG. 7 is a sketch, greatly simplified, of an image-forming telescope according to this invention;

FIG. 8 is a sketch, greatly simplified, of a lens arrangement using a cylindrical secondary mirror.

Figure 9:
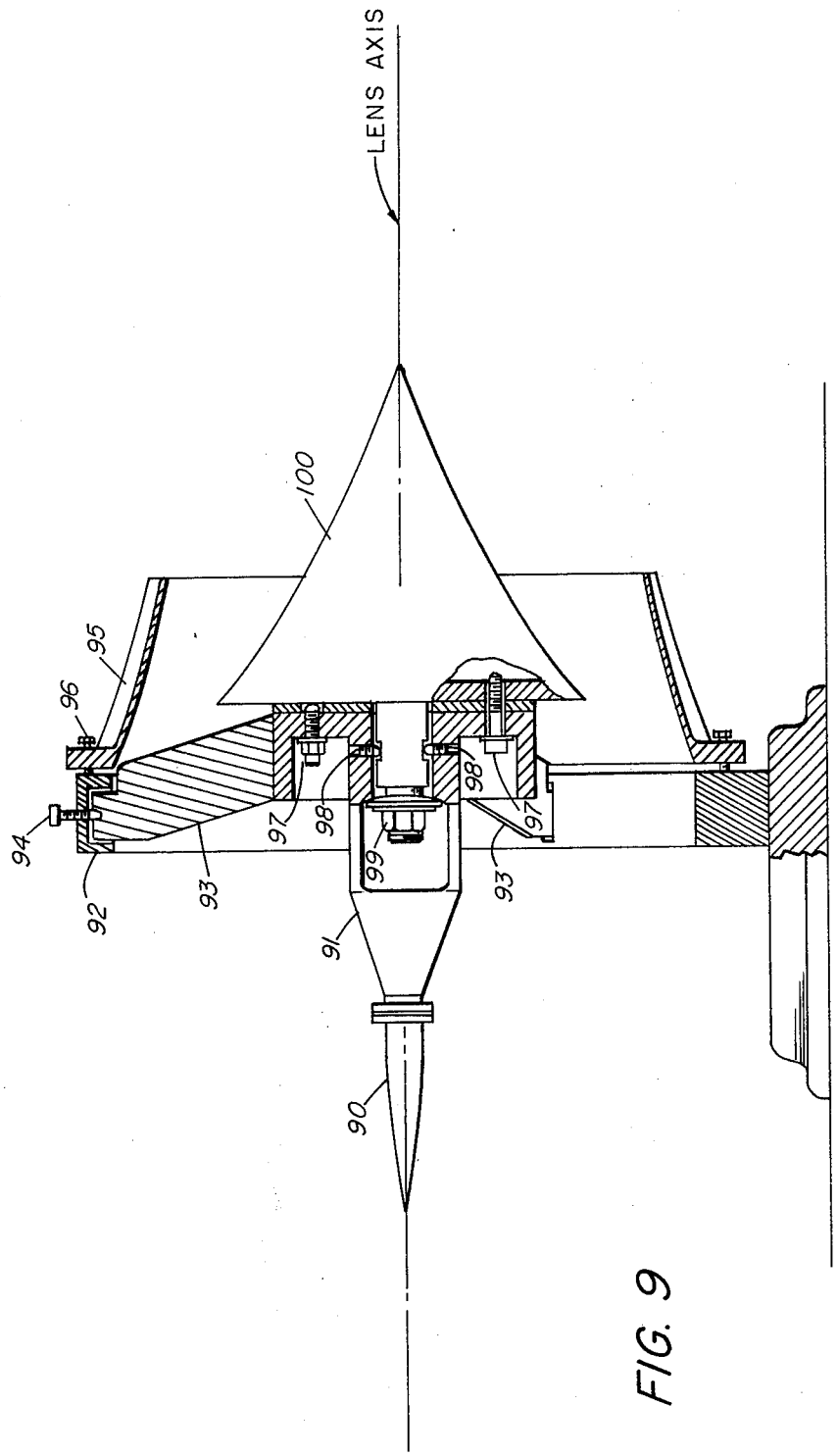
Figure 9A:
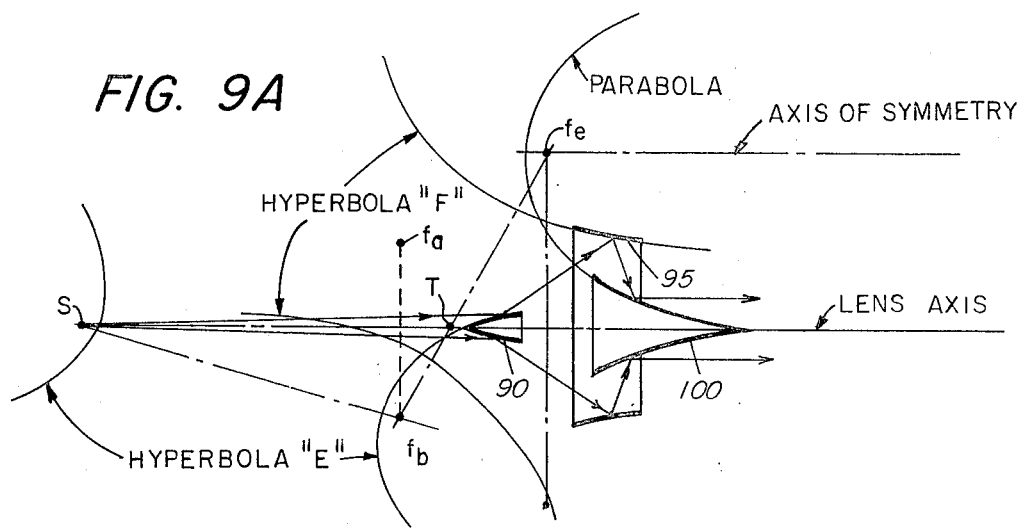
Figure 10:
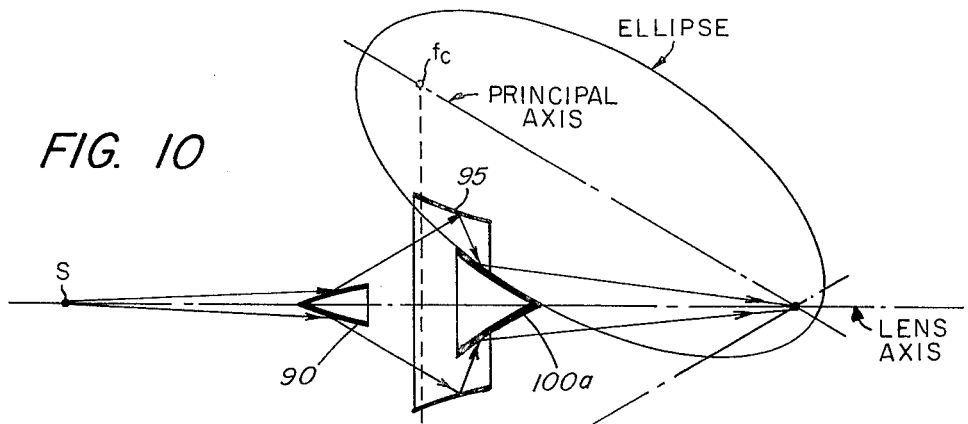
Figure 11:
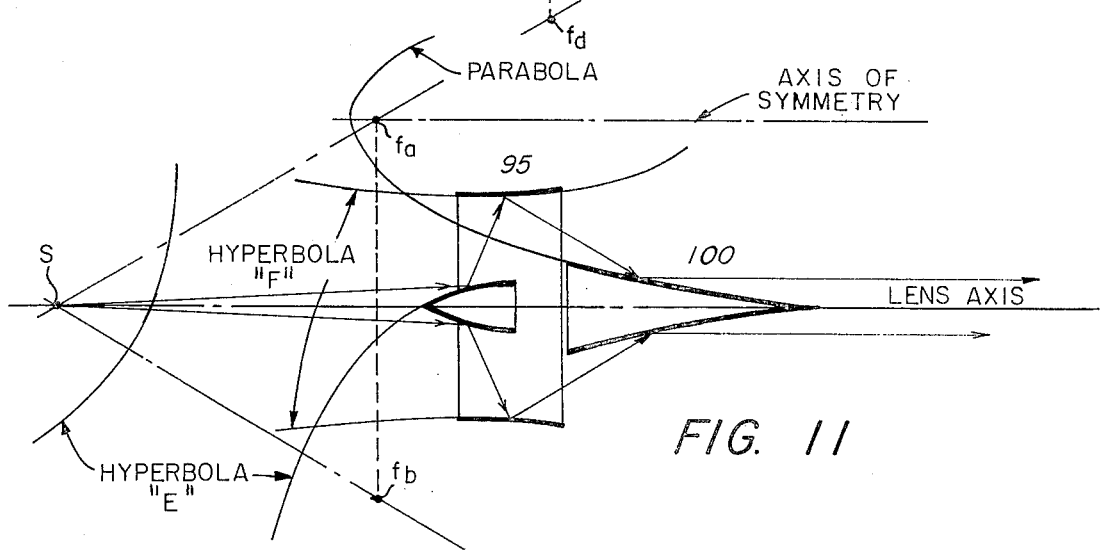
Figure 12:
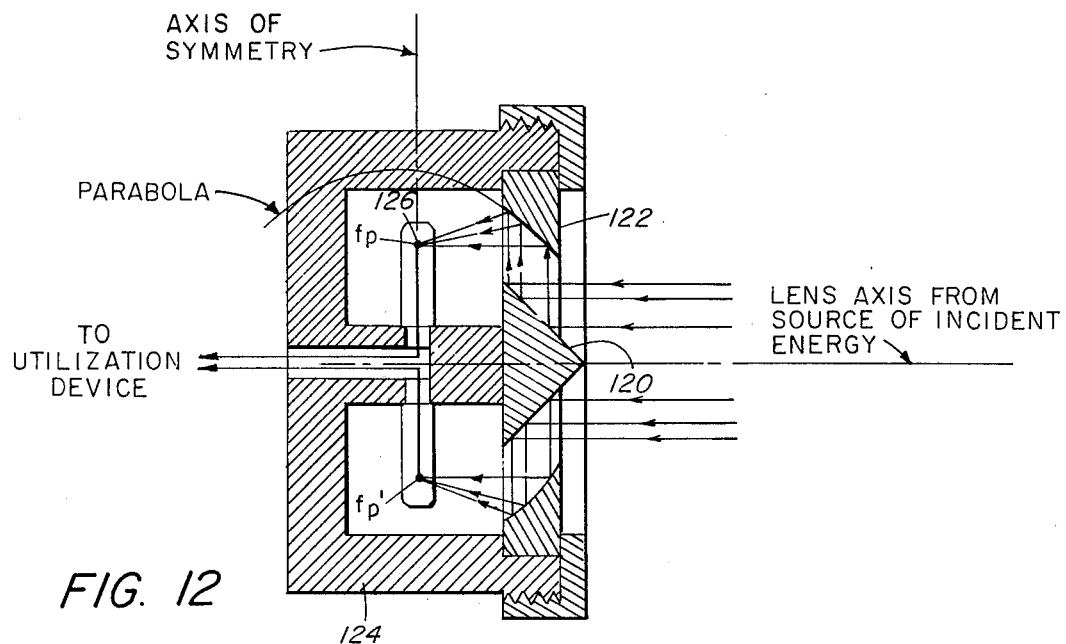
Figure 13:
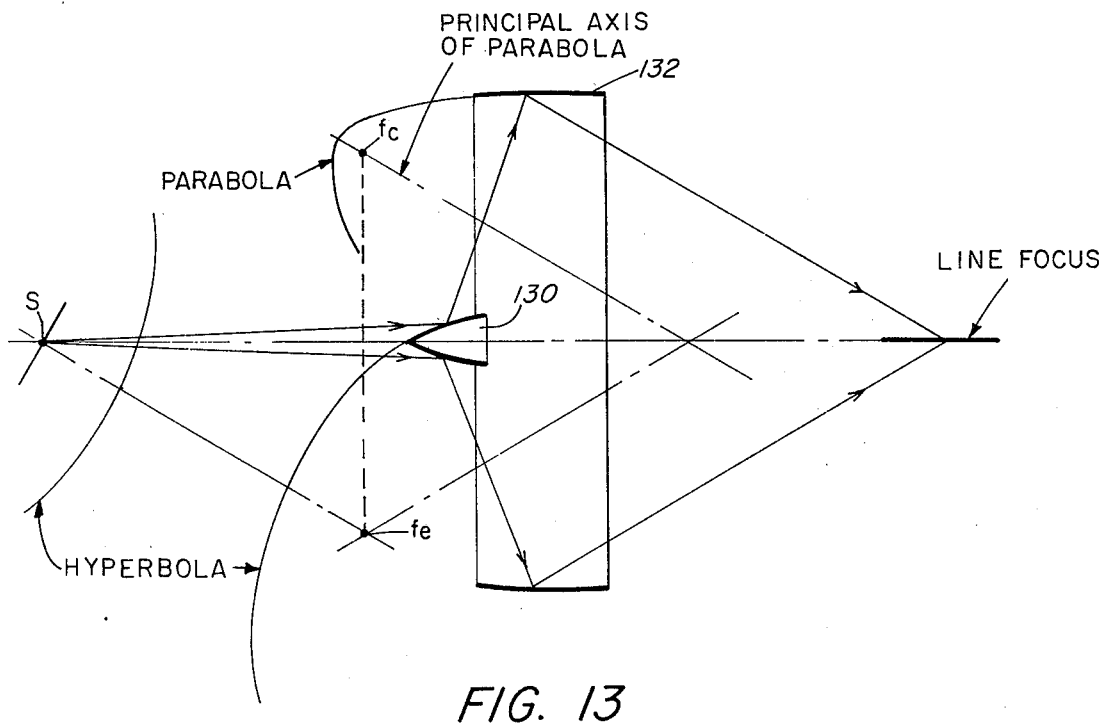

FIG. 9 is a cross-sectional view of a way in which a symmetrical catoptric lens arrangement may be assembled to reduce its overall length;

FIG. 9A is a sketch, greatly simplified, illustrating a meridional section of the reflecting surfaces of the mirrors in FIG. 9 and the quadratic curves from which such surfaces may be generated;

FIG. 9A is a sketch, greatly simplified, illustrating a meridional section of the reflecting surfaces of the mirrors in FIG. 9 and the quadratic curves from which such surfaces may be generated;

FIG. 10 is a sketch, greatly simplified, of a meridional section of a lens arrangement similar to that shown in FIGS. 9 and 9A with an exit mirror adapted to focus wave propagated energy at a point;

FIG. 11 is a sketch, greatly simplified, of a meridional section of an alternative embodiment of the lens arrangement shown in FIG. 9A;

FIG. 12 is a sketch, greatly simplified, of a meridional section of a symmetric lens arrangement adapted to focus a collimated beam of wave propagated energy along the circumference of a circle, the elements of such lens arrangement being supported with respect to each other by structure which does not obstruct the wave propagated energy; and FIG. 13 is a sketch, greatly simplified, of a meridional section of a lens arrangement adapted to focus an initially divergent beam of wave propagated energy into a line.

Before referring to the drawings, it will be noted that the reflecting surface of each one of the various mirrors is sometimes described in terms of its generatrix. It is felt that a person of ordinary skill in the art could, upon knowing the shape of each such surface in terms of its generatrix and the wavelength of the wave-propagated radiant energy, fabricate each mirror. That is, any person of skill would recognize that the various reflecting surfaces must be "smooth," meaning that the tolerance of each one of such surfaces be held within, say, one-eighth of a wavelength of the radiant energy passing through the disclosed lens arrangements. Obviously, then, the construction of the various mirrors will depend upon the wavelength of the radiant energy, varying all the way from "optically smooth" (for light) to wire mesh (for radio frequency energy).

Figure 1:
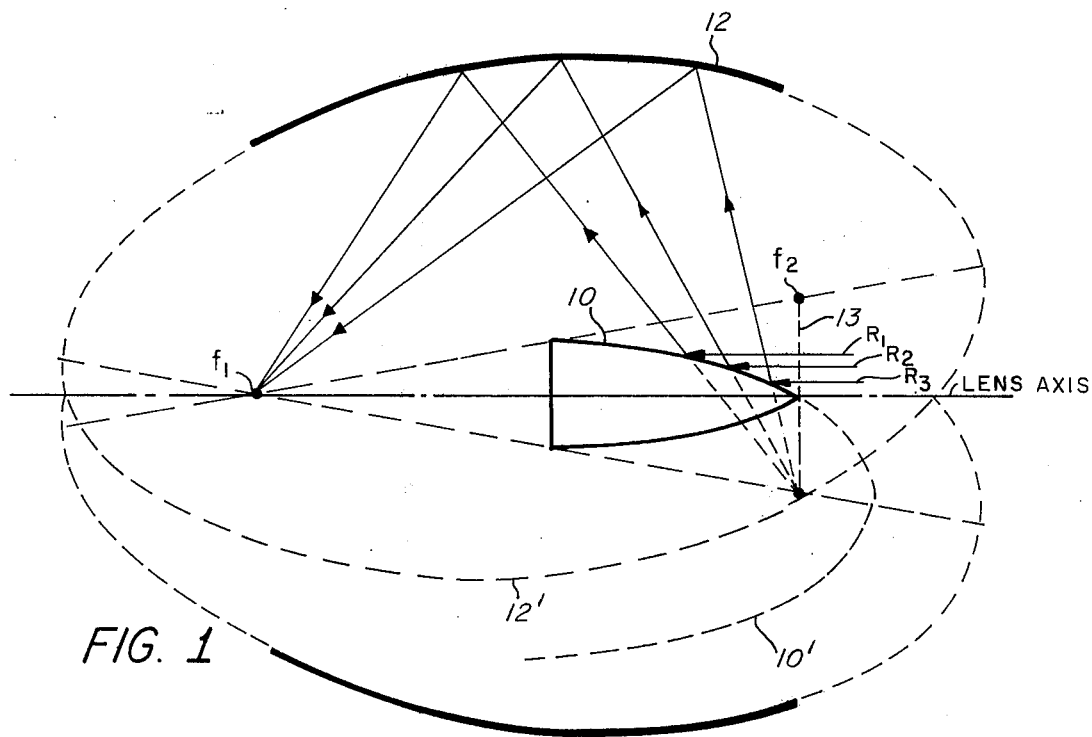
FIG. 1 is a sketch, greatly simplified, showing the manner in which the reflective elements of an elementary catoptric arrangement according to one aspect of this invention may be formed and disposed with respect to one another.

Referring now to FIG. 1, it may be seen that a primary mirror 10 and a secondary mirror 12 are here disposed symmetrically about a lens axis (not numbered). The reflecting surface of the primary mirror 10 is, in this example, to ogive formed by rotating a portion of a parabola 10' about the lens axis. The focal point of such parabola 10' (which is also the virtual focal point of the primary mirror 10) describes a focal circle 13 in a plane orthogonal to the lens axis, the radius of such circle here being equal to the semilatus rectum of the parabola 10'.

The reflecting surface of the secondary mirror 12 here is formed by nutating a portion of an ellipse 12' about the lens axis. One focal point, $f_1$, of the ellipse 12' is maintained on the lens axis and the second focal point, $f_2$, is made to correspond with the focal circle 13 as the ellipse is nutated.

It will now be obvious that axial rays, as $R_1$, $R_2$, $R_3$, falling on the primary mirror 10 will be reflected therefrom and directed toward the secondary mirror 12 as shown. That is, each one of the axial rays $R_1$, $R_2$, $R_3$ is reflected to diverge in a direction such that each appears to have originated at a point on the focal circle 13. Therefore, because $f'$ is also an actual focal point of the secondary mirror 12, all of the rays reflected from the primary mirror 10 will, after reflection from the secondary mirror 12, pass through the focal point, $f_1$.

A moment's thought will make it clear that, because the primary mirror 10 and the secondary mirror 12 are symmetrical about the lens axis, the angular orientation of the axial rays about such axis does not affect their focusing. That is, all axial rays which impinge on the primary mirror 10 are focused at the focal point, $f_1$, of the secondary mirror 12. It will be noted here that axial rays may enter into the illustrated lens system without falling on the primary mirror 10. Such of these rays which do not impinge upon the secondary mirror 12 simply pass through the lens system without effect. Those axial rays which fall directly upon the secondary mirror 12 are, however, reflected toward the lens axis but not toward the focal point, $f_1$. The effective aperture of the illustrated lens system, then, is equal to the area of the base of the primary mirror 10. It will be evident now that the effective aperture may be optimized so that only axial rays which fall on the primary mirror 10 may enter the lens system. In the illustrated example such optimization could be effected by extending the secondary mirror 12 until the circle formed by its forward (here its right hand) edge has the same diameter as the base of the primary mirror 10, or by increasing the diameter of the base of the primary mirror 10 to the same effect.

It will be observed that axial rays, meaning rays from a point source at a great distance from the lens arrangement shown in FIG. 1 are perfectly focused. That is, for such rays, the len arrangement is aberration free. A different situation exists for paraxial rays, meaning rays from a point source relatively close to the lens arrangement or from an extended object. The elementary lens arrangement shown in FIG. 1 is susceptible to achromatic aberrations when radiant energy is received in the form of paraxial rays. The amount of spherical aberration or coma is dependent upon the angular difference between any paraxial ray and an axial ray at any point on the reflecting surface of the primary mirror 10. It has been found that when such angular difference is equal to or less than 6°, the elementary lens arrangement of FIG. 1 may, by a judicious selection of generatrices of the reflecting surfaces of the primary mirror 10 and the secondary mirror 12, be corrected for spherical aberration or coma. Thus, if the generatrix of the reflecting surface of the primary mirror is selected to be a section of a parabola close to the vertex (meaning near to the axis of symmetry) of such parabola and the generatrix of the reflecting surface of the secondary mirror 12 is selected to be an appropriate section of the ellipse 12', spherical aberration and coma may be reduced to an insignificant amount. Such reduction is possible by reason of the fact that the position and size of the focal circle 13 are both adjustable so that the spherical aberration and coma of the primary mirror 10 may be compensated by the secondary mirror 12. In the elementaty lens arrangement shown in FIG. 1 it is not possible to correct for curvature of field of distortion. The latter type of aberration may, however, be corrected in a known manner by substituting for the quadratic conic surfaces of either the primary mirror 10 or the secondary mirror 12 in a higher order curve. Curvature of field may be corrected in a conventional manner by adding an aplanic reflecting surface between the secondary mirror 12 and the focal point $f_1$. Obviously, if such an expedient is followed the image will appear at a point other than $f_1$.

It will be noted that the length of the elementary lens arrangement along the lens axis may be varied by changing the size of the focal circle 13. In other words, the focal point $f_1$ may be moved along the lens axis by chosing appropriate generatrices for the reflecting surfaces of the primary mirror 10 and the secondary mirror 12.

Figure 2:
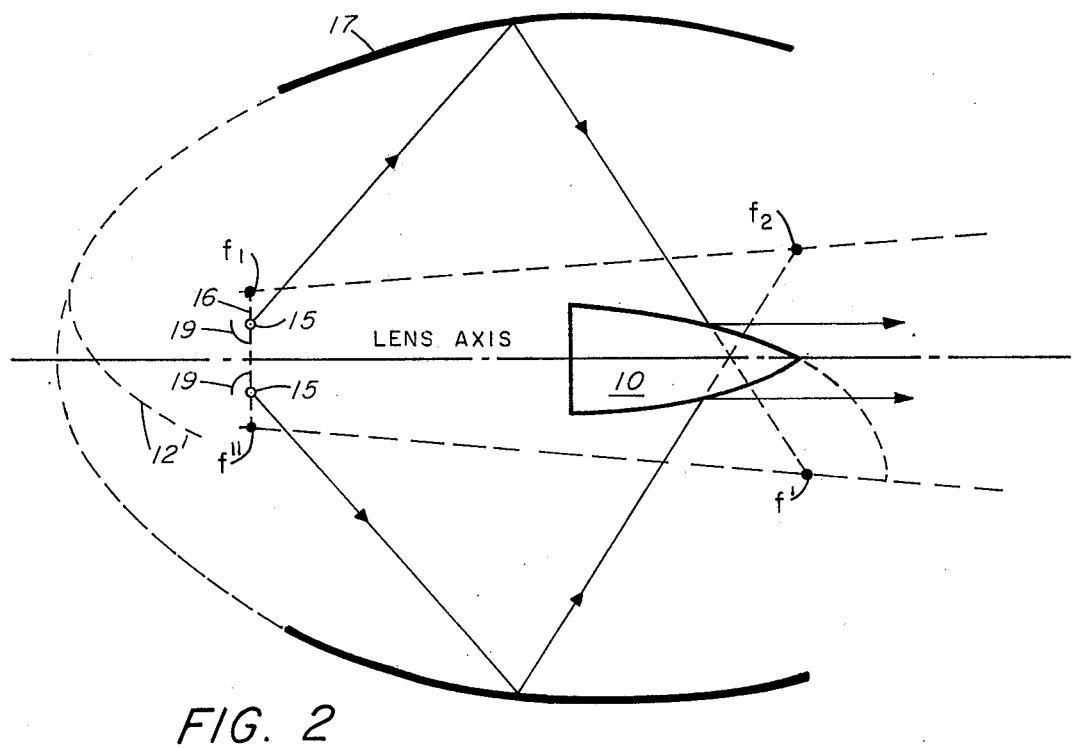
FIG. 2 is a sketch, again greatly simplified, of a second embodiment of this invention intended to produce a collimated beam of radiant energy from a catoptric lens arrangement.

Referring now to FIG. 2 it may be seen that the lens arrangement illustrated in FIG. 1 may be adapted to produce a collimated beam by disposing, in any convenient manner, sources 15 of radiant energy, as incandescent lamps or arcs, at points along the focal circle 16 of a reflector 17. The latter element is similar to the secondary mirror 12 of FIG. 1 except that the focal point $f_1$ of the ellipse 12' is spaced from the lens axis. That is, the focal circle 16 is the locus of the focal point $f_1$ as the ellipse 12' is rotated. As a result, then, light emitted from any one of the sources 15 and reflected from both the reflector 17 and the primary mirror 10 is formed into a collimated beam (not numbered). In the illustrated arrangement light from each one of the sources of light 15 is concentrated on the reflector 17 by means of auxiliary mirrors 19. Each such auxiliary mirror obviously increases the amount of light from each source thereof which contributes to the collimated beam.

Referring now to FIGS. 3 and 4, it may be seen that the principles of the invention may be followed to provide a "diffraction limited to infinity focusing system" for paraxial rays. As shown in FIG. 3, a lens arrangement (to be described in connection with FIG. 4) is disposed in the path of a diverging beam of light 20 from a source, as a laser 21. The apparent origin of the beam of light is the point "0" (sometimes referred to hereinafter as the "conjugate" focal point). Without diffraction in the lens arrangement, the beam of light 20, after passing through the lens arrangement, would be focused at point "1". Because of diffraction in the lens arrangement, however, the emergent beam of light diverges as shown. The divergence angle of the emergent beam of light 20 may be determined by solving:

$$d(\text{in radians}) = k(L)/D \qquad \text{Eq. (1)}$$

where
$k = 2.44$ for a circular exit aperture in the lens arrangement;
$L =$ the wavelength, in meters, of the radiant energy; and
$D =$ the diameter, in meters, of the exit aperture of the lens arrangement.

The lens arrangement here (as shown in FIG. 4) includes an entrance mirror 23, a secondary mirror 12' and an exit mirror 25 arranged along a lens axis (not numbered) as shown. The reflecting surface of the entrance mirror 23 here corresponds to the surface formed by nutating a section of one branch 23a of a hyperbola about the lens axis with the apparent origin 0 stationary. Such nutation then causes: (a) the focal point of the branch 23a to trace out a circle (hereinafter sometimes referred to as the primary virtual focal circle $(f_2, f')$; and (b) the reflecting surface of the entrance mirror 23 to be ogival in shape and symmetrically disposed around the lens axis.

As is known with any hyperbola, the tangent at any point thereon bisects the angle formed by the lines to such point from the conjugate foci of the two branches of the hyperbola. It is also known that the angle of incidence of any ray of radiant energy to the tangent of a curved reflecting surface equals the angle of reflection of that ray to the same tangent. It follows, then, that each paraxial ray in the beam 20 which falls on the reflecting surface of the entrance mirror 23, upon reflection from such surface, will apparently have originated at a point on the primary virtual focal circle $f_2f'$.

Because the reflecting surface of the secondary mirror 12' is here the same as the reflecting surface corresponding to the surface formed by nutating a section of an ellipse about the lens axis so that the locus of one focal point of the ellipse corresponds with the primary virtual focal circle $f_2f'$, each one of the paraxial rays reflected from the primary mirror 23 also apparently originates at a point on the locus of one focal point of the secondary mirror 12'. Therefore, upon reflection from the secondary mirror 12', such rays are directed toward the second "focus" of the secondary mirror 12'. As shown in FIGS. 2 and 4, the reflecting surface of the secondary mirror 12' is formed to correspond with the surface generated by nutating a section of an ellipse about the lens axis in such a manner that the locus of the second focal point of the ellipse is a circle, as shown by $f_1f''$. Therefore, the second focus of the secondary mirror 12' corresponds to such circle and, after reflection from the secondary mirror 12', the rays are directed to points along such circle.

The exit mirror 25, here having a reflecting surface corresponding to the surface obtained by rotating a section of a branch 25a of a hyperbola about the lens axis, is interposed between the secondary mirror 12' and its focal circle $f_1f''$. The locus of the focal point of the branch 25a forms a circle coincident with the focal circle $f_1f''$ of the secondary mirror 12'. It follows, then, that the rays reflected from the exit mirror 25 are directed toward the focus "I" of the second branch 25b of the hyperbola.

It will now be apparent that the lens arrangement shown in FIG. 4 is, under some conditions, inherently free of spherical aberration. That is, the energy in any paraxial rays from a point source of radiant energy located at the conjugate focal point, here 0, of the hyperbola from which the generatrix of the primary mirror 23 is taken will, disregarding diffraction for the moment, be focused at point I after passing through the lens arrangement shown in FIGS. 3 and 4. It is equally evident that such a point source cannot cause coma, astigmatism or distortion. If, however, energy from a source not at the conjugate focal point 0 is considered, a different situation obtains. Thus, if a point source is located on the lens axis at a point removed from the conjugate focal point 0, all rays reflected from the primary mirror 23 will not apparently originate from the primary virtual focal circle $f_2f'$. If the point source is between the conjugate foci, the rays reflected from the primary mirror 23 will apparently originate at a primary virtual focal circle which is displaced toward such source; conversely, if the point source is beyond the conjugate foci, the rays reflected from the primary mirror 23 will apparently originate at a primary virtual focal circle which is displaced away from such source. In the former case, after reflection from the secondary mirror 12', the rays will be directed toward a focal circle which is displaced toward the source from the secondary focal circle $f_1f''$. In the latter case the rays will be directed toward a focal circle which is oppositely displaced from the secondary focal circle $f_1f''$. The exit mirror 25 may be moved so that the plane of its virtual focal circle corresponds with the focal circle to which the reflected rays from the secondary mirror 12' are directed. When this is done, the rays (after reflection from the reflecting surface of the exit mirror 25) are directed to a conjugate focus. Obviously, then, spherical aberration may be corrected.

It will be evident now that considering a point source on the lens axis, the illustrated lens arrangement may be adjusted so as to be "aberration-free". Therefore, in considering the actual performance of the lens arrangement, it is necessary to consider diffraction. With this particular lens arrangement the aperture of the exit lens 25 is the critical factor. Therefore, with any given wavelength for the radiant energy, the diameter of the base of the exit mirror 25 should be as large as possible.

Figure 5:
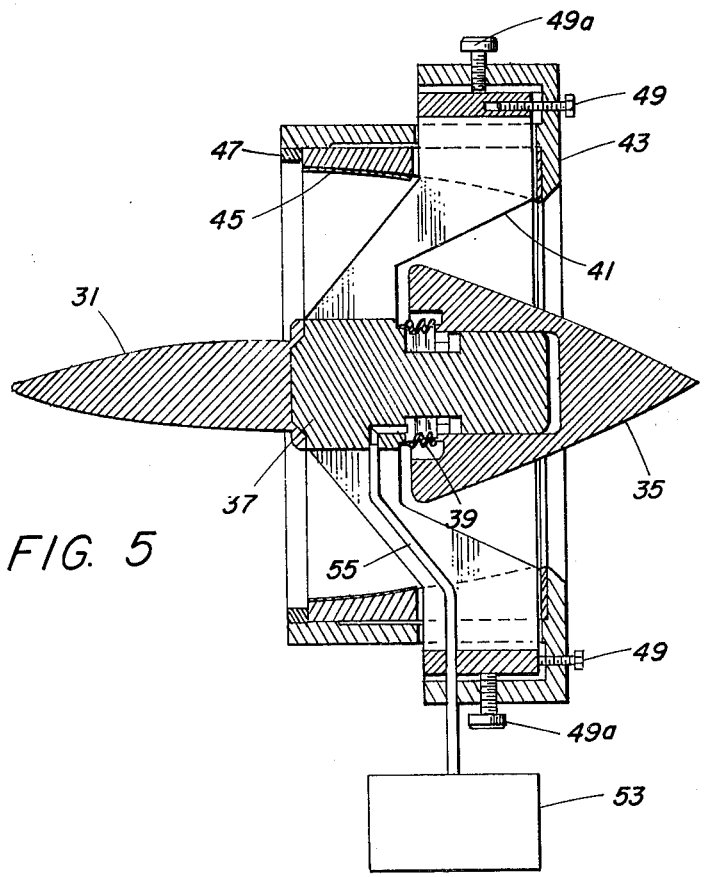
FIG. 5 is a cross-sectional view of different ways in which catoptric lens arrangements as shown in FIGS. 1, 2, 3 or 4 may be assembled.

Referring now to FIG. 5, it may be seen that any of the schematically illustrated lens arangements shown hereinbefore may be implemented in a practical way now to be described. Thus, in FIG. 5 primary mirror 31 and an exit mirror 35 are mounted on a hub 37. The primary mirror 31 preferably is affixed to the hub 37 and the exit mirror 35 is preferably slidably mounted on the hub 37 as shown. A bellows 39 is affixed to the hub 37 and the exit mirror 35 so as to form a chamber (not numbered). A member of identical spiders 41 are affixed to the hub 37 to connect the latter to a rim 43. The inside of the latter is shaped as shown to support a secondary mirror 45 (which mirror here has a reflecting surface which corresponds to the parellipsoidal surface of the secondary mirror 12'). A retaining ring 47 holds the secondary mirror 45 in place with respect to the rim 43. Each one of the spiders 41 is adjustably connected to the ring 43 by means of an adjusting screw 49. The ring 43 and the spiders 41 are, further, spaced one from the other by adjusting screws as shown. To complete the assembly a pump 53 is connected through a pipe 55 to the chamber.

It may be seen that, with the mounting shown, the secondary mirror 45 is held in place relative to the ring 43. Further, it may be seen that the position of the spiders 41 relative to the ring 43 may be changed (by movement of the adjusting screws 49, 49a) so that the longitudinal centerline of the hub 37 is coincident with the axis of symmetry of the secondary mirror 45. It may also be seen that the positions of the primary mirror 31 along the axis of symmetry of the secondary mirror may be adjusted so that the primary virtual focal circle of the former coincides with one of the focal circles of the latter. Finally, it may be seen that by operation of the pump 53, the position of the exit mirror 35 along the axis of symmetry may be adjusted relative to the second focal circle of the secondary mirror 45.

Referring now to FIGS. 6 and 6A, it may be seen that the principles of this invention may also be applied to a lens arrangement using two convex reflecting surfaces to focus a diverging beam. In this embodiment a primary mirror 60 (having a reflecting surface corresponding to the surface developed by nutating a portion of one branch 60a of a hyperbola about a lens axis) cooperates with an exit mirror 12" (which is similar to the primary mirror 23 of FIG. 4). The primary mirror 60 has the general appearance, as shown in FIG. 6A, of a funnel with curved sides. As before, if a source of radiant energy is disposed at the conjugate focal point of the nutated branch (here point 0), all rays reflected from the primary mirror 60 will appear to have originated from points on the focal circle $f_o, f_o'$. Such reflected rays, then, upon being reflected from the reflecting surface of the exit mirror 12″ will be focused at the conjugate focal point of the branch 12a of the hyperbola from which the reflecting surface of the exit mirror 12″ was developed (here at point I).

It is evident that the lens arrangement shown in FIG. 6 suffers, to some degree, from aperture blockage. That is, a portion of the radiant energy entering the aperture of the primary mirror 60 is intercepted by the base of the exit mirror 12″ and is, therefore, prevented from passing through the lens arrangement to the point I. Obviously, however, the relative amount of aperture blockage may be reduced by increasing the ratio of the aperture of the primary mirror 60 to the diameter of the base of the exit mirror 12″. The limitation on such adjustment is, of course, the diffraction which may be tolerated.

Referring now to FIG. 7, it may be seen that the principles of this invention may be followed to combine curved mirrors to construct a Cassegrainian type catoptric lens arrangement in which symmetrical reflectors are used without aperture blockage. Thus, in FIG. 7, a primary mirror 70 combines with a secondary mirror 72 to focus radiant energy without aperture blockage. The reflecting surface of the primary mirror 70 here is concave, corresponding to the surface generated by nutating a portion of a parabola 70a about the lens axis. The reflecting surface of the secondary mirror 72 here is convex, corresponding to the surface generated by nutating a portion of a hyperbola 72a about the lens axis. With the real focal circle of the primary mirror 70 and the virtual focal circle of the secondary mirror 72 coincident, it will be apparent that collimated radiant energy falling on the primary mirror 70 will be reflected toward points on the real focal circle. Before reaching such circle the energy is reflected from the secondary mirror 72 toward the conjugate focal point, here point I.

A moment's thought will make it clear that the length of the lens arrangement shown in FIG. 7 (meaning the distance from the tip of the cusp (not numbered) in the primary mirror 70 to the point I is not directly related to the size of the aperture of the primary mirror 70. That is, the aperture may be varied widely without requiring a corresponding change in the position of the point I.

Referring now to FIG. 8, it may be seen that the principles of this invention may be applied to the design of a "three element" lens arrangement in which only the entrance and exit mirrors are confocal. Thus, in FIG. 8 an entrance mirror 80 (the reflecting surface of such mirror being either paraboloidal or parahyperboloidal with a focal circle, $f_{80}-f'_{80}$) and an exit mirror 82 (the reflecting surface of such mirror being paraboloidal with its focal circle coincident with the focal circle $f_{80}-f'_{80}$) are disposed along a lens axis as shown. A cylindrical mirror 84 is placed around the other two mirrors. It will be noted that the axis of symmetry of the cylindrical mirror need not be exactly coincident with the lens axis so long as the two axes are substantially parallel to each other.

It will now be evident that the focal circle $f_{80}-f'_{80}$ serves as an image circle for rays reflected from the entrance mirror 80. Therefore, if the entrance mirror is paraboloidal and the rays falling on the entrance mirror 80 are substantially parallel to the lens axis, the rays reflected first from the entrance mirror 80 and then from the cylindrical mirror 84 to the exit mirror 82 will apparently have originated at image points along the focal circle $f_{80}-f'_{80}$. Therefore, upon reflection from the exit mirror 82, such rays will again be parallel to each other. If the reflecting surface of the entrance mirror 80 is parahyperboloidal and paraxial rays from a source at the conjugate focus (as in FIG. 3) fall on the entrance mirror 80, the rays reflected from the exit mirror 82 are also parallel to each other. In this case, in contrast to the case illustrated in FIG. 3, the diameter of the beam out of the lens arrangement may be made to be smaller than the diameter of the entering beam.

It should be noted here that the lens arrangement shown in FIG. 8 may easily be converted to an arrangement which focuses axial or paraxial rays. Thus, if the exit mirror 82 is changed from its illustrated concave paraboloidal shape to a concave parellipsoidal shape, i.e. the shape generated by nutating a portion of an ellipse about the lens axis as described hereinbefore, rays reflected from such surface may be caused to focus at the conjugate focal point of such parellipsoidal shape. It should also be noted that although the lens elements of the lens arrangement illustrated are disposed along the lens axis that there is but a single reflection of any ray from the cylindrical mirror 84. Such disposition of the lens elements may be changed by moving the exit mirror 82 along the lens axis so that multiple reflections from the cylindrical mirror 84 are possible. If such a modification is made, it is, of course, necessary to change the shape of the exit mirror 82, always maintaining its confocality with the entrance mirror 80.

Referring now to FIGS. 9 and 9A it may be seen that the principles of this invention may be followed to provide a catoptric lens arrangement with a concave exit mirror and a pair of convex mirrors to derive a diffraction-limited collimated beam from an initially divergent beam. Thus, an entrance mirror 90, affixed in any convenient manner, is supported on a hub 91. The latter, in turn, is centrally supported within a mounting ring 92 by spiders 93 which are positioned by means of adjusting screws 94. A secondary mirror 95 is secured to the mounting ring 92 by adjusting screws 96. The hub 91 is formed to accept adjusting screws 97, 98, 99 which cooperate, as shown, with an exit mirror 100. As was the case in the arrangement shown in FIG. 5, the relative position of the entrance mirror 90, the secondary mirror 95 and the exit mirror 100 may be adjusted so that the axis of symmetry of each is coincident and their positions along the lens axis may also be adjusted.

The reflecting surface 90' (FIG. 9A) of the entrance mirror 90 corresponds to the surface formed by rotating a section of one branch of a hyperbola "E" about the lens axis. Such a motion is equivalent to nutating the hyperbola E about the lens axis with one focal point being held on such axis at point "S". The focal point of the branch containing the chosen section is, therefore, displaced from the lens axis and the locus of such focal point is a circle, $f_a,f_b$.

The reflecting surface 95' (FIG. 9A) of the secondary mirror 95 corresponds to the surface formed by rotating a section of one branch of a hyperbola "F" about the lens axis. As before, such a movement is equivalent to nutating the hyperbola F about the lens axis. In this case, however, both focal points are spaced from the lens axis. That is, the point "T" on the principal axis of the hyperbola F is held on the lens axis. It follows then that the focal point in one branch may be caused to describe the circle $f_a, f_b$ and that the focal point of the branch of the hyperbola F from which the generatrix of the reflecting surface 95' is selected may be caused to form a circle $f_c, f_d$. The planes of circles $f_a, f_b$ and $f_c, f_d$ are, of course, perpendicular to the lens axis.

The reflecting surface 100' (FIG. 9A) of the exit mirror 100 corresponds to the surface formed by rotating a section of a parabola "P" about the lens axis. The focal point of the parabola P is caused to be coincident with the circle, $f_c, f_d$, formed by the focal point of the branch of the hyperbola F from which the reflecting surface 95' was generated. The axis of symmetry of the parabola P is parallel to the lens axis.

It is an inherent property of a hyperbola that the tangent to any point on one branch bisects the angle formed by the lines from such point to the focal points of the two branches of the hyperbola. It follows, therefore, that if a source of a diverging beam is located at point S to illuminate only a portion of the reflecting surface 90' of the entrance nirror 90, all rays reflected from that surface will appear to have originated along the focal circle $f_a, f_b$. Similarly, after reflection by the reflecting surface 95', the rays will appear to have originated along the focal circle $f_c, f_d$. It is an inherent property of a parabola that the normal to any point bisects the angle formed by the line through the point parallel to the principal axis and the line between the point and the focal point of the curve. It follows then that, after reflection from the reflecting surface 100' of the exit mirror 100, the rays in the emergent beam are parallel to each other. That is, within diffraction limits, the emergent beam is collimated.

Referring now to FIG. 10 it may be seen that the exit mirror 95 of FIGS. 9 and 9A may be replaced by a mirror having a shape to focus the emergent beam. Thus, a mirror 100a, having a reflecting surface corresponding to the surface formed by nutating a section of an ellipse "El" about the lens axis, may be used as the exit mirror. One focal point, $f_e$, of the ellipse El is held on the lens axis and the other focal point is caused to coincide with the focal circle $f_c, f_d$. It is an inherent property of an ellipse that the normal at any point thereon (except at the ends of the major axis) bisects the lines from the point to the focal points of the curve. It follows then that, after reflection from the reflecting surface of the mirror 100a, the rays in the emergent beam are, within diffraction limits, focused at the focal point, $f_e$.

Referring now to FIG. 11, it may be seen that the embodiment shown in FIG. 9 may be further modified so that the three mirrors share a common focal circle, $f_a'', f_b''$. The main difference between the embodiment shown in FIG. 11 and that shown in FIG. 9 is, as is evident in FIG. 11, that the axis of symmetry of the hyperbola F is perpendicular to the lens axis.

Referring now to FIG. 12 it may be seen that, by using a folded optical path, it is possible according to this invention to focus a collimated beam on a focal circle using only one mirror with a quadratic conic reflecting surface. Thus, an entrance mirror 120 having a conical reflecting surface (not numbered) is disposed, as shown, on the lens axis. As is evident, such a reflecting surface is effective to change the direction of axial rays (not numbered) to a direction orthogonal to the lens axis. The so-deflected rays then fall on the reflecting surface (not numbered) of a secondary mirror 122 and are reflected therefrom toward points on a focal circle $f_p, f_p'$. The reflecting surface of the secondary mirror 122 corresponds to the shape obtained by rotating a section of a parabola P'' about the lens axis, the principal axis of such parabola being perpendicular to the lens axis. The focal point of the parabola P'' is, of course, removed from the lens axis by a distance sufficient to avoid obscuration by the entrance mirror 120. In this connection it will be observed that the flat back side of the entrance mirror 120 here provides an ideal area for mounting that mirror without any aperture blockage. Thus, a mount 124 passing through the focal circle $f_p, f_p'$ is extended around to support the secondary mirror 122 as shown. A moment's thought will make it clear that such a mounting arrangement totally avoids aperture blockage yet provides a simple and secure way to align and hold the entrance mirror 120 and the secondary mirror 122. Further thought will make it apparent that the fact that the energy in the incident beam is focused in a circle makes the lens arrangement shown in FIG. 12 particularly well adapted to use in a so-called "monopulse" system. That is, if sensors 126 (two of which are indicated) for the energy being received are placed at 90° intervals along the focal circle $f_p, f_p'$, it is evident that appropriate sum and difference signals may be derived to determine whether or not the source (not shown) of the incident energy lies on the lens axis, and, if such source is not on the lens axis, the direction of such source relative to the sensors 126. If the incident energy is in a divergent beam, it will now be obvious that the concave paraboidal reflecting surface of the secondary mirror 122 could be changed to a hyperboidal or parellipsoidal shape to effect the desired focusing. It will also be evident that the arrangement of FIG. 12 may be used to project a beam in a manner similar to that shown in FIG. 2, i.e. by placing sources on the focal circle $f_p, f_p'$ and illuminating the secondary mirror 122. As a matter of fact, sources and sensors could be interleaved. Finally, with respect to FIG. 12, it will be noted that the same effect could be attained by using a single concave paraboloidal mirror (as the entrance mirror shown in FIG. 7), the focal circle of the generating parabola being coincident with the focal circle $f_p, f_p'$. When this is done the secondary mirror would, of course, be replaced by a bezel to limit the field.

Referring now to FIG. 13 it may be seen that it is not necessary, when using a paraboloidal reflecting surface, that the principal axis of the generating parabola be parallel, or orthogonal, to the lens axis. Thus, in FIG. 13, a diverging beam from a source, S, is directed on to the reflecting surface of an entrance mirror 130. The rays in the beam are, after reflection by the entrance mirror, further divergent. After reflection from the reflecting surface of a secondary mirror 132 the rays are parallel to a line focus on the lens axis. The reflecting surface of the entrance mirror 130 here corresponds to the shape generated by rotating a section of one branch of a hyperbola about the lens axis, holding one focal point at "S" and moving the other through a circle $f_c, f_c'$. The reflecting surface of the secondary mirror 132 corresponds to the surface generated by rotating a section of a parabola about the lens axis. Again, this corresponds to nutating the parabola around the lens axis so that the focal point of the parabola coincides with the focal circle $f_c, f_c'$ and the principal axis of the parabola intersects the lens axis.

Having described my invention by showing several of its different embodiments, it will be apparent that many changes and modifications may be made without departing from my inventive concepts. For example, it will be evident that the number and shape of the lens elements may be changed so long as the idea of having lens elements with image points displaced from the lens axis is followed. Further, it is evident that a change in the particular type of radiant energy to be passed through a lens arrangement incorporating the principles of the invention requires only that the dimensions of the lens arrangement are changed in accordance with the wavelength of the radiant energy. That is, lens arrangements according to the invention may be made for electromagnetic radiations of any wavelength or for acoustic waves by simply changing the dimensions of the various elements. Further, it will be evident that a lens arrangement according to this invention may include planar or aplanic mirrors to fold the paths of the radiant energy or to compensate for astigmatism or distortion. For example, in the embodiment shown in FIG. 7 conventional planar mirrors or reflecting prisms may be placed in the path of the energy reflected from the secondary mirror to shorten the overall depth of the illustrated lens arrangement. Alternatively, the quadratic reflecting surfaces (or some of them) shown in the various embodiments may be replaced by conventional higher order curved surfaces to compensate for such aberrations. It is felt, therefore, that the invention should not be restricted to its disclosed embodiments but rather should be limited only by the spirit and scope of the appended claims.

I claim:

1. A catoptric lens arrangement for converting a diverging beam of wave-propagated energy from a source thereof into a collimated beam, the axes of both such beams being coincident with a lens axis, such arrangement comprising:
   a. an entrance mirror having a convex reflecting surface, such surface corresponding to the surface generated by a section of one branch of a first hyperbola nutated around the lens axis, one focal point of such hyperbola being coincident with the source and the other focal point describing a first circle about the lens axis;
   b. a secondary mirror having a convex reflecting surface, such surface corresponding to the surface generated by a section of one branch of a second hyperbola nutated around the lens axis, one focal point of such hyperbola describing a circle coincident with the first circle and the other focal point describing a second circle about the lens axis; and,
   c. an exit mirror having a concave reflecting surface, such surface corresponding to the surface generated by a section of a parabola rotated about the lens axis, the focal point of such parabola describing a circle coincident with the second circle and the principal axis being parallel to the lens axis.

2. A catoptric lens arrangement as in claim 1 wherein the first and the second circles are coincident.

3. A catoptric lens arrangement as in claim 1 wherein the concave reflecting surface of the exit mirror corresponds to the surface generated by a section of an ellipse nutated about the lens axis, one focal point of such ellipse describing a circle coincident with the second circle and the second focal point being on the lens axis.

4. A catoptric lens arrangement for focusing the energy in a collimated beam of wave-propagated energy on a focal circle orthogonal to a lens axis, such arrangement comprising:
   a. an entrance mirror having a reflecting surface corresponding to the surface of a right circular cone, the altitude of such cone being coincident with the lens axis;
   b. a secondary mirror having a concave reflecting surface, such surface corresponding to the surface generated by rotating a section of a parabola about the lens axis, the principal axis of such parabola being orthogonal to the lens axis; and,
   c. mounting means, coacting between the entrance mirror and the secondary mirror, for holding such mirrors in position relative one to the other to direct wave-propagated energy between the entrance mirror and the secondary mirror in directions substantially orthogonal to the lens axis.

5. A catoptric lens arrangement for focusing a collimated beam of wave-propagated energy onto a focal circle orthogonal to a lens axis, such arrangement comprising:
   a. a concave mirror, the reflecting surface thereof corresponding to the surface generated by rotating a section of a parabola about the lens axis, such section being outside the latus rectum of the parabola so that the focal point of the parabola describes the focal circle; and,
   b. a bezel disposed orthogonally to the lens axis to define a field of view for the concave mirror.

6. A catoptric lens arrangement for focusing a diverging beam of wave-propagated energy from a source thereof in a line along a lens axis, such arrangement comprising:
   a. a entrance mirror having a convex reflecting surface, such surface corresponding to the surface generated by a section of one branch of a hyperbola nutated around the lens axis, one focal point of such hyperbola being coincident with the source and the other focal point describing an entrance focal circle about the lens axis; and,
   b. a secondary mirror having a concave reflecting surface, such surface corresponding to the surface generated by a section of a parabola nutated around the lens axis, the focal point of such parabola describing an exit focal circle coincident with the entrance focal circle and the principal axis of such parabola intersecting the lens axis.

7. For wave-propagated energy, a catoptric lens arrangement wherein a pair of reflecting surfaces is disposed along a lens axis, such arrangment comprising:
   a. a first reflecting surface to be illuminated by the wave-propagated energy, the shape of such surface corresponding to the shape formed by rotating a selected portion of a first quadratic conic section about the lens axis so that the locus of a focal point of the first quadratic conic section is a circle centered on the lens axis, such first reflecting surface causing aberration of wave-propagated energy reflected therefrom;
   b. a second reflecting surface disposed in the path of wave-propagated energy reflected from the first reflecting surface, the shape of such surface corresponding to the shape formed by rotating a second quadratic conic section about the lens axis, such second reflecting surface causing substantially equal and opposite aberration of wave-propagated energy to the aberration caused by the first reflecting surface.

8. For wave-propagated radiant energy, a catoptric arrangement wherein a number of reflecting surfaces are disposed along a system axis, such arrangement comprising:
   a. a primary reflective surface, the shape thereof corresponding to the shape formed by moving a selected portion of a first quadratic conic section having an axis of symmetry about the system axis, such portion being removed from the axis of symmetry of such section so that the locus of a focal point of such section is a line spaced from the system axis;
   b. a secondary reflective surface, the shape thereof corresponding to the shape formed by moving a selected portion of a second conic section having a first and a second focal point about the system axis so that the locus of the first focal point of the secondary reflective surface coincides with the locus of the focal point of the first quadratic conic section.

9. A catoptric arrangement as in claim 8 wherein:
   a. the selected portion of the first quadratic conic section is adjacent to the vertex thereof, thereby causing aberration of the wave-propagated radiant energy reflected from the primary reflective surface; and,
   b. the selected portion of the second quadratic conic section is aberrant to such energy in substantially an equal and opposite amount.

10. For wave-propagated radiant energy from a laser, a catoptric arrangement having mirrors disposed along a system axis, such arrangement comprising:
    a. a first mirror, such mirror having a convex reflecting surface with focal points on the circumference of a circle concentric with the system axis in a plane orthogonal thereto;
    b. a second mirror, such mirror having a concave reflecting surface with focal points coincident to the focal points of the first mirror; and,
    c. means for mounting the first mirror and the second mirror to align the axis of symmetry of each one thereof with the system axis.

11. An arrangement as in claim 10 wherein the reflective surface of the first mirror corresponds to the surface of rotation of a portion of a parabola about the system axis, such portion being removed from the vertex of the parabola and the principal axis of the parabola being parallel to the system axis.

12. For wave-propagated radiant energy from a laser, a catoptric arrangement having the elements thereof disposed along a system axis, such arrangement comprising:
    a. a first element, such element including a convex mirror with focal points on the circumference of a circle concentric with the system axis in a plane orthogonal thereto;
    b. a second element, such element including a concave mirror having focal points coincident with the focal points of the convex mirror and conjugate focal points lying on a circle concentric with the system axis in a plane orthogonal thereto; and
    c. means for mounting the convex mirror and the concave mirror to align the axis of symmetry of each one thereof with the system axis.

13. A catoptric arrangement as in claim 12 having additionally:
    a. a third element including a convex mirror with focal points on the circumference of a circle corresponding to the circle on which the conjugate focal points of the concave mirror lie; and,
    b. means for aligning the convex mirror in the third lens element with the concave mirror to move the focal points of such convex mirror into coincidence with the circle on which the conjugate focal points of the concave mirror lie.

14. A catoptric arrangement as in claim 13 wherein each one of the convex mirrors in the first and the third elements corresponds to a surface of rotation formed by nutating a portion of one branch of a hyperbola about the system axis, the conjugate focal point of such hyperbola being on the system axis.

15. For wave-propagated radiant energy, a catoptric arrangement having mirror elements disposed along a system axis, such arrangement comprising:
    a. A primary mirror, such mirror having a convex reflective surface corresponding to the surface generated by nutating a selected portion of a first hyperbola about the system axis; and
    b. a secondary mirror, such mirror having a convex reflective surface corresponding to the surface generated by nutating a selected portion of a second hyperbola about the system axis.

16. A catoptric arrangement as in claim 15 wherein the curvature of the reflective surface of the primary mirror is opposite to the curvature of the secondary mirror and the axes of symmetry of the two such mirrors are collinear with the system axis.

17. For wave-propagated radiant energy, a catoptric arrangement wherein a number of elements are disposed along a system axis, such arrangement comprising:
    a. a concave entrance mirror, the reflective surface thereof corresponding to the surface generated by rotating a selected portion of a parabola about the system axis, such portion being removed from the vertex of such parabola;
    b. a convex secondary mirror disposed around the periphery of the entrance mirror, the reflective surface of such secondary mirror corresponding to the surface generated by nutating a portion of a branch of a hyperbola about the system axis, the focal point of the branch being coincident with the focal point of the parabola and the conjugate focal point of the hyperbola lying on the system axis.

* * * * *